(12) United States Patent
Park

(10) Patent No.: US 7,781,253 B2
(45) Date of Patent: Aug. 24, 2010

(54) IMAGE SENSOR AND METHOD OF MANUFACTURING THE SAME

(75) Inventor: Jeong-Su Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 166 days.

(21) Appl. No.: 11/947,411

(22) Filed: Nov. 29, 2007

(65) Prior Publication Data

US 2008/0150067 A1     Jun. 26, 2008

(30) Foreign Application Priority Data

Dec. 21, 2006   (KR) ...................... 10-2006-0131548

(51) Int. Cl.
    *H01L 21/00*     (2006.01)
(52) U.S. Cl. .............. 438/74; 438/57; 438/69; 438/73; 257/E21.001; 257/E31.057
(58) Field of Classification Search ........... 438/74, 438/75; 257/440, E21.001, E31.057
    See application file for complete search history.

(56) References Cited

U.S. PATENT DOCUMENTS

| 6,635,543 B2 * | 10/2003 | Furukawa et al. ........... 438/311 |
| 6,930,336 B1 * | 8/2005 | Merrill ....................... 257/292 |
| 7,132,724 B1 * | 11/2006 | Merrill ....................... 257/440 |
| 7,352,043 B2 * | 4/2008 | Gidon .......................... 257/440 |
| 2002/0058353 A1 * | 5/2002 | Merrill ........................ 438/57 |
| 2006/0138494 A1 * | 6/2006 | Lee ............................ 257/292 |
| 2006/0145221 A1 * | 7/2006 | Lee ............................ 257/294 |
| 2007/0072386 A1 * | 3/2007 | Kim ............................ 438/400 |
| 2007/0181977 A1 * | 8/2007 | Lochtefeld et al. .......... 257/618 |

* cited by examiner

*Primary Examiner*—Charles D Garber
*Assistant Examiner*—Angel Roman
(74) *Attorney, Agent, or Firm*—Sherr & Vaughn, PLLC

(57) ABSTRACT

An image sensor including a first epitaxial layer formed over a semiconductor substrate; first photodiodes formed spaced apart in the first epitaxial layer; a first isolation region electrically isolating the first photodiodes from each other; a second epitaxial layer formed over the first epitaxial layer; second photodiodes formed spaced apart in the second epitaxial layer; and a second isolation region electrically isolating the second photodiodes from each other.

12 Claims, 4 Drawing Sheets

IMAGE SENSOR AND METHOD OF MANUFACTURING THE SAME

Figure 1:
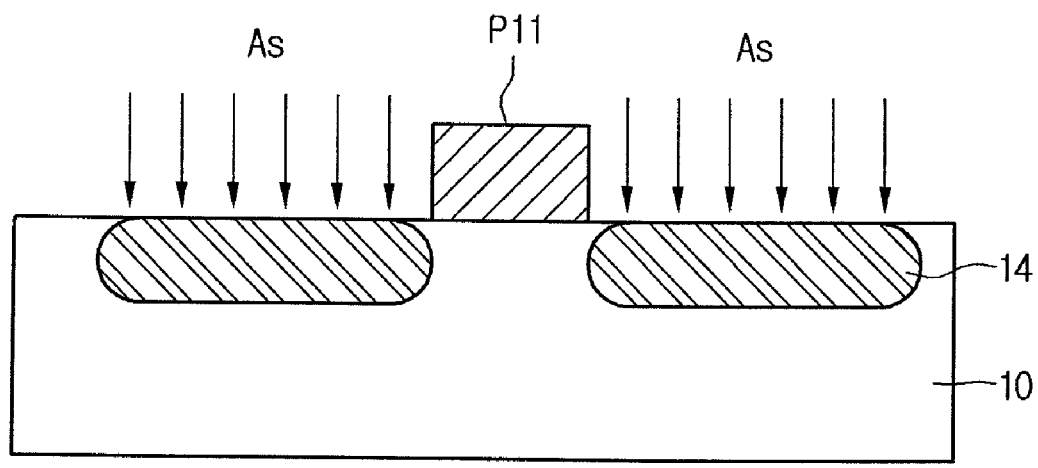

The present application claims priority under 35 U.S.C. 119 and 35 U.S.C. 365 to Korean Patent Application No. 10-2006-0131548 (filed on Dec. 21, 2006), which is hereby incorporated by reference in its entirety.

BACKGROUND

An image sensor is a semiconductor device that converts images into electric signals. An image sensor may be classified a charge coupled device (CCD) image sensor and a complimentary metal oxide semiconductor (CMOS) image sensor.

The CCD image sensor may include a plurality of metal oxide semiconductor (MOS) capacitors, and the MOS capacitor operates by transferring carriers generated by light. Meanwhile, the CMOS image sensor may include a plurality of unit pixels and a CMOS logic circuit controlling output signals of each unit pixel.

An image sensor may include a substrate, a red photodiode, a green photodiode, a blue photodiode, a plurality of plugs for transferring signals generated from each photodiode to a surface of the semiconductor substrate and a transistor for transferring signals.

In the image sensor having the above structure, isolation between the photodiodes may become an important factor as the size of pixels is reduced. Thus, an isolation region may be formed by doping impurities for facilitating electrical isolation between the photodiodes, and a thermal process may then be performed for stabilizing the doped impurities. In this case, a lateral diffusion of the doped impurities may occur. However, in order to form the isolation region by the doped impurities, an additional mask must be fabricated. In addition, the lateral diffusion of the impurity ions occurs during the subsequent heat process, so the doping profile is changed. Accordingly, the isolation region may not sufficiently perform its function, exerting a bad influence on the image quality.

SUMMARY

Embodiments relate to an image sensor and a method of manufacturing the same, in which an additional mask is not required for isolation between photodiodes.

Embodiments relate to an image sensor and a method of manufacturing the same, in which a lateral diffusion can be prevented by using a mask for forming an alignment key of an epitaxial layer. Accordingly, electrical isolation between photodiodes can be enhanced, thereby improving the overall characteristics of the image sensor.

Embodiments relate to an image sensor including a substrate, an epitaxial layer and photodiodes, whereby a mask alignment key can be formed simultaneously with an isolation region between photodiodes by using a mask for a pattern alignment of the epitaxial layer.

Embodiments relate to a method of manufacturing the image sensor that can include at least one of the following steps: forming a first epitaxial layer over a semiconductor substrate; forming a pair of first photodiodes in the first epitaxial layer; forming a first photoresist pattern over the first epitaxial layer, wherein the first photoresist pattern includes a first opening provided over and corresponding to a first region of the first epitaxial layer and a second opening between the first photodiodes provided over and corresponding to a second region of the first epitaxial layer; simultaneously forming a first alignment key in the first region and a first isolation region in the second region; forming a second epitaxial layer over the first epitaxial layer; forming a pair of second photodiodes in the second epitaxial layer; forming a second photoresist pattern over the second epitaxial layer including the second photodiodes, wherein the second photoresist pattern includes a third opening provided over and corresponding to a third region of the second epitaxial layer and a fourth opening between the second photodiodes provided over and corresponding to a fourth region of the second epitaxial layer; simultaneously forming a second alignment key in the third region of the second epitaxial layer and a second isolation region in the fourth region of the second epitaxial layer; forming a third epitaxial layer including a plurality of third photodiodes over the second epitaxial layer.

Embodiments relate to a method of manufacturing the image sensor that can include at least one of the following steps: forming an epitaxial layer over a semiconductor substrate; forming photodiodes in the epitaxial layer; forming a mask pattern over the epitaxial layer, wherein the mask pattern includes a first opening provided over and corresponding to a first region of the epitaxial layer and a second opening between the photodiodes provided over and corresponding to a second region of the epitaxial layer; and then simultaneously forming an alignment key in the first region and a isolation region in the second region.

Embodiments relate to an image sensor that can include a first epitaxial layer formed over a semiconductor substrate; first photodiodes formed spaced apart in the first epitaxial layer; a first isolation region electrically isolating the first photodiodes from each other; a second epitaxial layer formed over the first epitaxial layer; second photodiodes formed spaced apart in the second epitaxial layer; and a second isolation region electrically isolating the second photodiodes from each other.

DRAWINGS

Example FIGS. 1 to 7 illustrate a method of manufacturing an image sensor, in accordance with embodiments.

DESCRIPTION

As illustrated in example FIG. 1, in accordance with embodiments, a method of manufacturing an image sensor can include first epitaxial layer 10 formed on and/or over a semiconductor substrate. The semiconductor substrate can include a silicon substrate doped with at least one of N-type impurities and P-type impurities. First photoresist pattern P11 can be formed on and/or over first epitaxial layer 10. A pair of red photodiodes 14 can be formed in first epitaxial layer 10 by implanting impurity ions such as arsenic (As) using first photoresist pattern P11 as a mask.

Figure 2:
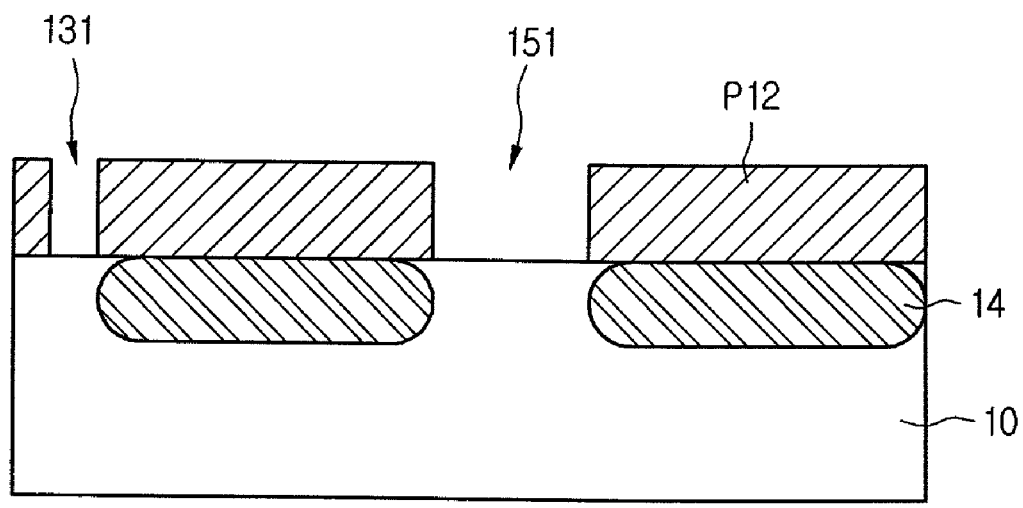

As illustrated in example FIG. 2, second photoresist pattern P12 can then be formed on and/or over first epitaxial layer 10 including red photodiodes 14. In accordance with embodiments, a mask for forming an alignment key can be formed such that the alignment key region is exposed together with the isolation region. By using the mask, second photoresist pattern P12 can be formed.

Second photoresist pattern P12 can include first opening 131 formed on and/or over a region corresponding to a first alignment key and second opening 151 formed between red photodiodes 14 on and/or over a region corresponding to a first isolation region.

Figure 3:
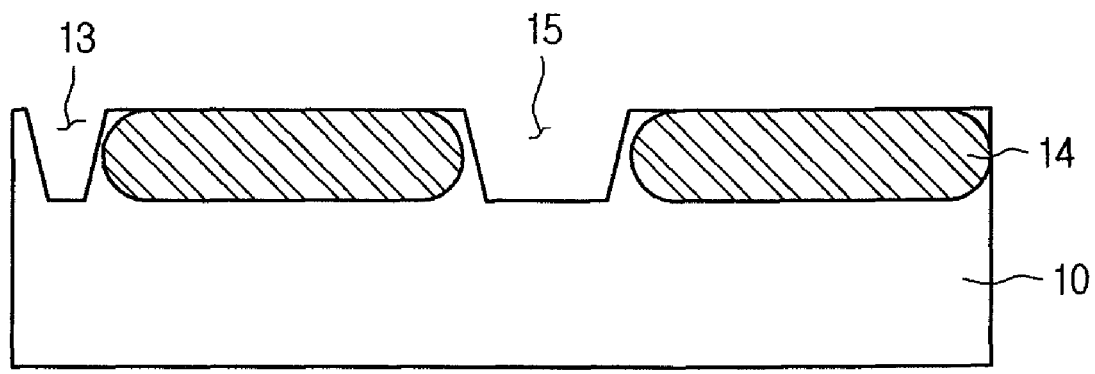

As illustrated in example FIG. 3, first epitaxial layer 10 can then be etched using second photoresist pattern P12 as a mask, thereby simultaneously forming first alignment key 13 and first isolation region 15. The etching method can include at least one of a dry etching process and a wet etching process. After formation of first alignment key 13 and first isolation region 15, second photoresist pattern P12 can be removed.

In accordance with embodiments, the alignment key region and the isolation region can be simultaneously formed by performing a single photoresist pattern process. In addition, the isolation region can be prepared by forming a trench using an etching process so as to prevent the lateral diffusion of the impurity ions.

Figure 4:
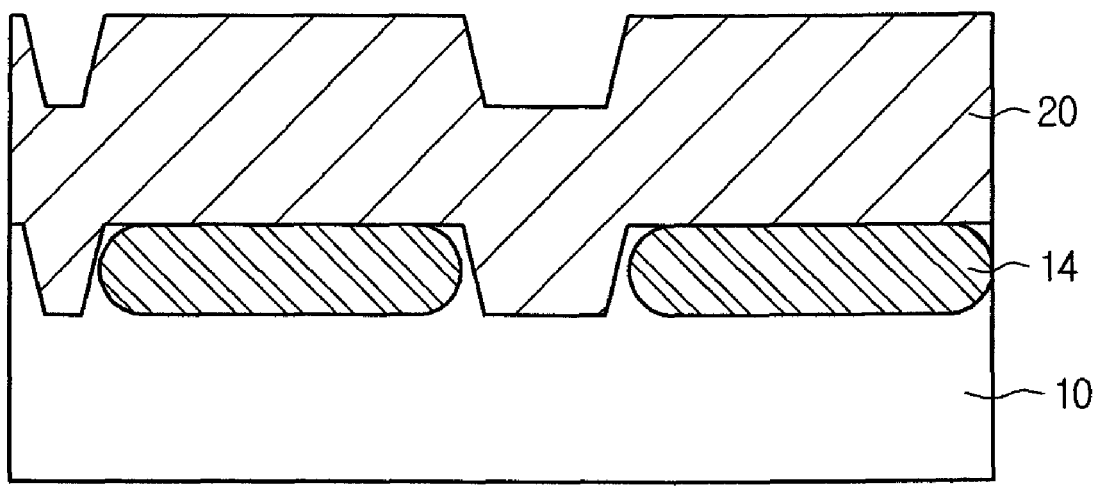

As illustrated in example FIG. 4, second epitaxial layer 20 can then be formed on and/or over first epitaxial layer 10 and have a bottommost surface corresponding to the uppermost surface of first epitaxial layer 10.

Figure 5:
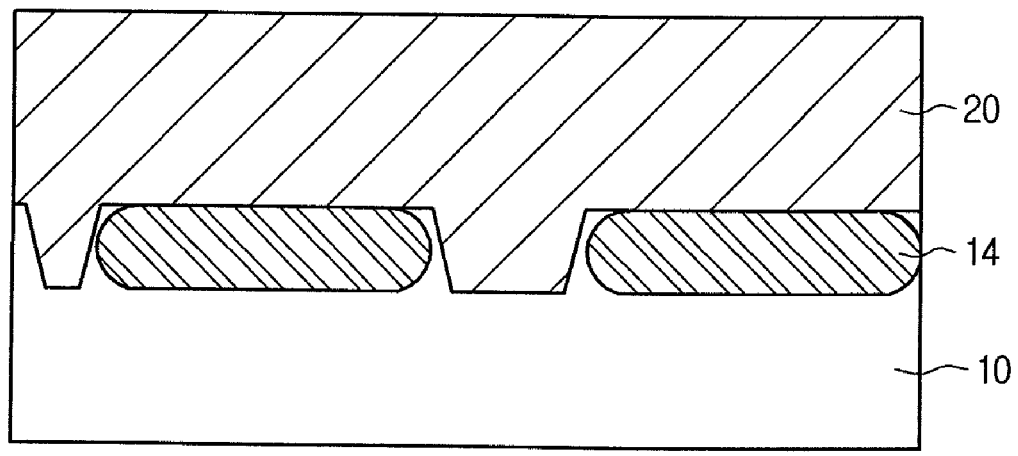

As illustrated in example FIG. 5, the uppermost surface of second epitaxial layer 20 may be planarized using a chemical mechanical polishing process. Accordingly, the step difference formed on the uppermost surface of second epitaxial layer 20 can be removed.

Figure 6:
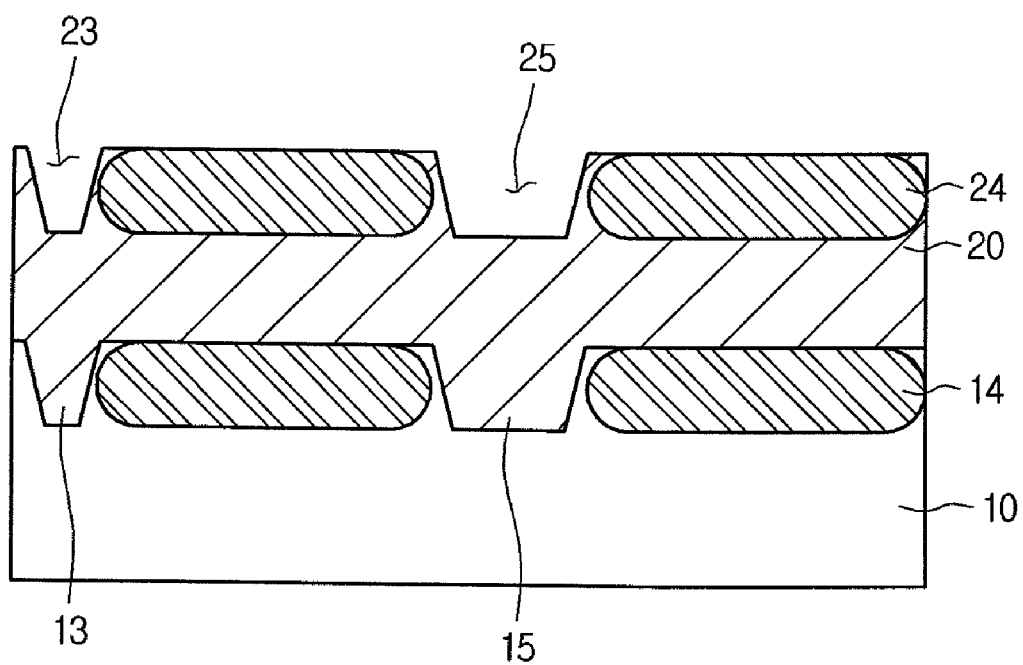

As illustrated in example FIG. 6, second alignment key 23, a pair of green photodiodes 24, and second isolation region 25 can then be formed in second epitaxial layer 20 by performing a process identical to that of forming red photodiodes 14 in first epitaxial layer 10.

Figure 7:
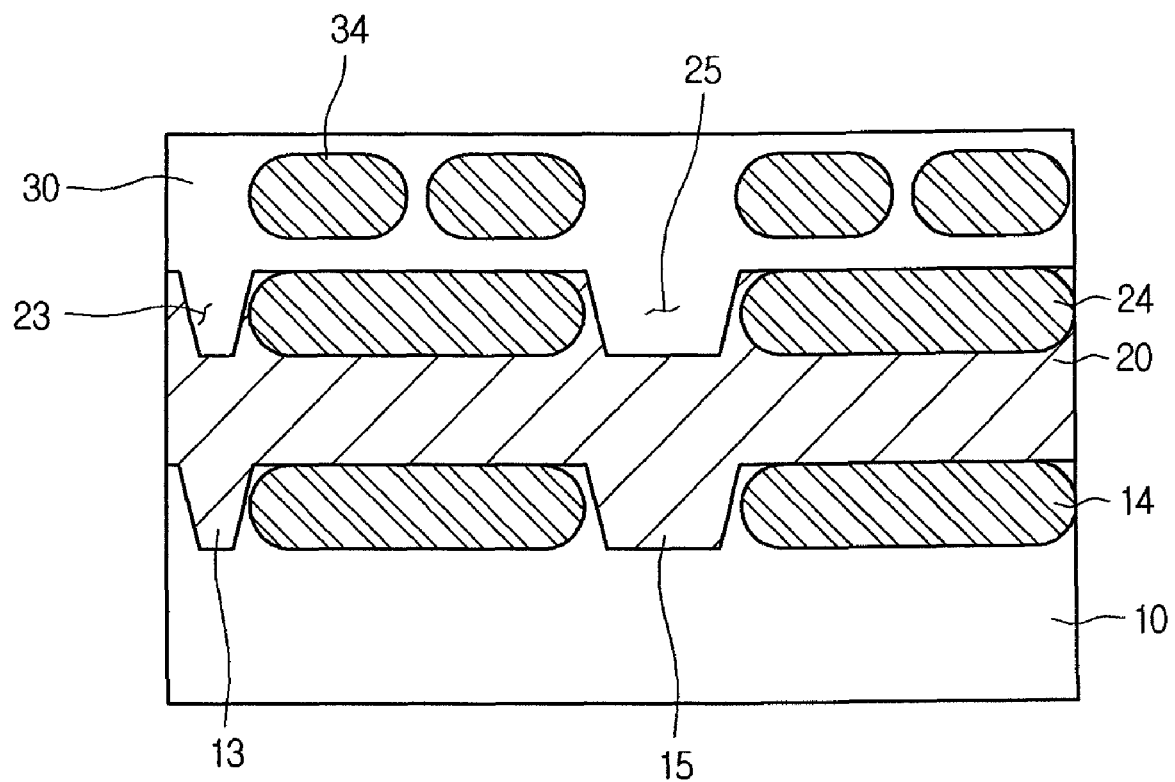

As illustrated in example FIG. 7, third epitaxial layer 30 can then be formed on and/or over second epitaxial layer 20 and have a bottommost surface corresponding to the uppermost surface of second epitaxial layer 20. A plurality of blue photodiodes 34 can then be formed by performing the identical process of forming red photodiodes 14 and green photodiodes 24, thereby completing the fabrication of an image sensor capable of minimizing the lateral diffusion. Unlike red photodiodes 14 and green photodiodes 24, blue photodiodes 34 can be formed in third epitaxial layer 30 at a larger depth from the uppermost surface thereof.

An image sensor manufactured in accordance with embodiments can include first epitaxial layer 10 formed on and/or over a semiconductor substrate. First alignment key 13, red photodiodes 14 and first isolation region 15 electrically isolating red photodiodes 14 can be formed in first epitaxial layer 10. First isolation region 15 can be formed as a trench in first epitaxial layer 10.

Second epitaxial layer 20 can then be formed on and/or over first epitaxial layer 10. Second alignment key 23, green photodiodes 24 and second isolation region 25 electrically isolating green photodiodes 24 can then be formed in second epitaxial layer 20. A plurality of plugs ma be formed in second epitaxial layer 20. Second insolating region 25 can also be formed as a trench.

Third epitaxial layer 30 can then be formed on and/or over second epitaxial layer 20. A plurality of blue photodiodes 34 can be formed in third epitaxial layer 30. A plurality of plugs ma be formed in third epitaxial layer 30.

In the image sensor and manufactured in accordance with embodiments, lateral diffusion can be prevented by using a mask for forming an alignment key of an epitaxial layer without using an additional mask for isolating photodiodes in the epitaxial layer, so that the electrical isolation between the photodiodes and also the image characteristics of the image sensor can be enhanced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming an epitaxial layer over a semiconductor substrate;
    forming photodiodes in the epitaxial layer;
    forming a mask pattern directly over and contacting the epitaxial layer including the photodiodes, wherein the mask pattern includes a first opening provided over and corresponding to a first region of the epitaxial layer and a second opening between the photodiodes provided over and corresponding to a second region of the epitaxial layer; and then
    simultaneously forming an alignment key in the first region and a isolation region in the second region.

2. The method of claim 1, wherein the photodiodes comprises at least one of red photodiodes and green photodiodes.

3. The method of claim 1, wherein the mask pattern comprises a photoresist pattern.

4. The method of claim 1, wherein simultaneously forming an alignment key in the first region and a isolation region in the second region comprises forming trenches in the epitaxial layer.

5. The method of claim 4, wherein the trenches are formed in the epitaxial layer using an etching process.

6. The method of claim 5, wherein the etching process comprises a dry etching process.

7. The method of claim 5, wherein the etching process comprises a wet etching process.

8. A method comprising:
    forming a first epitaxial layer over a semiconductor substrate;
    forming a pair of first photodiodes in the first epitaxial layer;
    forming a first photoresist pattern directly over and contacting the first epitaxial layer including the first photodiodes, wherein the first photoresist pattern includes a first opening provided over and corresponding to a first region of the first epitaxial layer and a second opening between the first photodiodes provided over and corresponding to a second region of the first epitaxial layer;
    simultaneously forming a first alignment key in the first region and a first isolation region in the second region;
    forming a second epitaxial layer over the first epitaxial layer;
    forming a pair of second photodiodes in the second epitaxial layer;
    forming a second photoresist pattern directly over and contacting the second epitaxial layer including the second photodiodes, wherein the second photoresist pattern includes a third opening provided over and corresponding to a third region of the second epitaxial layer and a fourth opening between the second photodiodes provided over and corresponding to a fourth region of the second epitaxial layer;
    simultaneously forming a second alignment key in the third region of the second epitaxial layer and a second isolation region in the fourth region of the second epitaxial layer;
    forming a third epitaxial layer including a plurality of third photodiodes over the second epitaxial layer.

9. The method of claim 8, wherein the first isolation region and the first alignment key are formed by etching the first epitaxial layer using the first photoresist pattern as a mask and the second isolation region and the second alignment key are formed by etching the second epitaxial layer using the second photoresist pattern as a mask.

10. The method of claim 8, wherein the first photodiodes comprises red photodiodes, the second photodiodes comprises green photodiodes and the third photodiodes comprises blue photodiodes.

11. The method of claim 8, wherein the first alignment key, the first isolation region, the second alignment key and the second isolation region are formed using a dry etching process.

12. The method of claim 8, further comprising planarizing the uppermost surface of the second epitaxial layer after forming the second epitaxial layer, wherein the uppermost surface of the second epitaxial layer is planarized by performing a chemical mechanical polishing process.

* * * * *